United States Patent
Hikita et al.

(10) Patent No.: US 8,101,972 B2
(45) Date of Patent: *Jan. 24, 2012

(54) NITRIDE SEMICONDUCTOR DEVICE AND METHOD FOR FABRICATING THE SAME

(75) Inventors: Masahiro Hikita, Hyogo (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/912,346

(22) Filed: Oct. 26, 2010

(65) Prior Publication Data

US 2011/0037100 A1 Feb. 17, 2011

Related U.S. Application Data

(62) Division of application No. 12/331,668, filed on Dec. 10, 2008, now Pat. No. 7,863,649.

(30) Foreign Application Priority Data

Dec. 10, 2007 (JP) .................................. 2007-318058

(51) Int. Cl.
*H01L 29/66* (2006.01)

(52) U.S. Cl. ................. 257/194; 257/196; 257/E29.248

(58) Field of Classification Search .................. 257/194, 257/196, E29.248

See application file for complete search history.

(56) References Cited

U.S. PATENT DOCUMENTS

| 7,038,252 | B2 | 5/2006 | Saito et al. |
| 7,576,373 | B1 | 8/2009 | Hikita et al. |
| 7,863,649 | B2 * | 1/2011 | Hikita et al. .................. 257/194 |
| 2003/0102482 | A1 | 6/2003 | Saxler |
| 2005/0189559 | A1 | 9/2005 | Saito et al. |
| 2006/0006414 | A1 | 1/2006 | Germain et al. |
| 2006/0060871 | A1 | 3/2006 | Beach |
| 2006/0255364 | A1 | 11/2006 | Saxler et al. |
| 2006/0273347 | A1 | 12/2006 | Hikita et al. |

(Continued)

FOREIGN PATENT DOCUMENTS

JP 11-261053 9/1999

(Continued)

OTHER PUBLICATIONS

Kawasaki T., et al., "Normally-off AlGaN/GaN HEMT with Recessed Gate for High Power Applications", Extended Abstracts of the 2005 International Conference on Solid State Devices and Materials, 2005, pp. 206-207.

(Continued)

*Primary Examiner* — Ngan Ngo
(74) *Attorney, Agent, or Firm* — McDermott Will & Emery LLP

(57) ABSTRACT

A nitride semiconductor device includes: first through third nitride semiconductor layers formed in sequence over a substrate. The second nitride semiconductor layer has a band gap energy larger than that of the first nitride semiconductor layer. The third nitride semiconductor layer has an opening. A p-type fourth nitride semiconductor layer is formed so that the opening is filled therewith. A gate electrode is formed on the fourth nitride semiconductor layer.

20 Claims, 5 Drawing Sheets

U.S. PATENT DOCUMENTS

| | | |
|---|---|---|
| 2007/0278521 A1 | 12/2007 | Ishida et al. |
| 2008/0079023 A1 | 4/2008 | Hikita et al. |
| 2008/0087915 A1 | 4/2008 | Uemoto et al. |
| 2008/0179694 A1 | 7/2008 | Nakazawa et al. |
| 2008/0258243 A1 | 10/2008 | Kuroda et al. |
| 2009/0121775 A1 | 5/2009 | Ueda et al. |
| 2009/0189187 A1 | 7/2009 | Briere et al. |

FOREIGN PATENT DOCUMENTS

| | | |
|---|---|---|
| JP | 2004-273486 | 9/2004 |
| JP | 2005-243727 | 9/2005 |
| JP | 2005-244072 | 9/2005 |

OTHER PUBLICATIONS

Kuroda, M., et al., "Normally-off Operation of Non-polar AlGaN/GaN Heterojunction FETs Grown on R-plane Sapphire", Extended Abstracts of the 2005 International Conference on Solid State Devices and Materials, 2005, pp. 470-471.

U.S. Notice of Allowance issued in U.S. Appl. No. 12/331,668, mailed Jul. 26, 2010.

U.S. Notice of Allowance issued in U.S. Appl. No. 12/331,668, mailed Oct. 6, 2010.

\* cited by examiner

NITRIDE SEMICONDUCTOR DEVICE AND METHOD FOR FABRICATING THE SAME

CROSS-REFERENCE TO RELATED APPLICATIONS

This application is a Divisional of U.S. patent application Ser. No. 12/331,668, filed on Dec. 10, 2008 now U.S. Pat. No. 7,863,649, claiming priority of Japanese Patent Application No. 2007-318058, filed on Dec. 10, 2007, the entire contents of each of which are hereby incorporated by reference.

BACKGROUND OF THE INVENTION

The present invention relates to nitride semiconductor devices and method for fabricating the nitride semiconductor devices, and particularly relates to a power transistor for use in, for example, a power supply circuit and a method for fabricating the power transistor.

In recent years, field effect transistors (FETs) made of gallium nitride (GaN)-based semiconductors have been intensively studied as high-frequency high-power devices. III-V nitride semiconductors such as GaN form various types of mixed crystal together with aluminum nitride (AlN) and indium nitride (InN). Thus, GaN-based semiconductors form heterojunctions in the same manner as conventionally-used arsenic-based semiconductors such as gallium arsenide (GaAs).

In particular, a heterojunction of a nitride semiconductor has a characteristic in which spontaneous polarization and/or piezoelectric polarization produces a high concentration of carriers at the interface thereof even when the nitride semiconductor is not doped. As a result, FETs using nitride semiconductors are likely to exhibit depletion-mode (normally-on) characteristics, and thus it is difficult to obtain enhancement-mode (normally-off) characteristics. However, most of the devices currently used in the power electronics market are normally-off devices, and normally-off operation is also strongly demanded for FETs using GaN-based semiconductors.

Normally-off FETs are implemented with, for example, a structure in which a gate region is recessed so that the threshold voltage is positively shifted (see, for example, T. Kawasaki et al., "Solid State Devices and Materials 2005 tech. digest", 2005, p. 206). A method with which a FET is fabricated on the (10-12) plane of a sapphire substrate so that no polarization electric field is generated in the crystal growth direction of nitride semiconductor (see, for example, M. Kuroda et al., "Solid State Devices and Materials 2005 tech. digest", 2005, p. 470) is also known. In addition, as a promising structure for obtaining a normally-off FET, a junction field effect transistor (JFET) in which a p-type GaN layer is formed as gate is proposed (see, for example, Japanese Laid-Open Patent Publication No. 2005-244072). In a JFET structure, piezoelectric polarization produced at the heterointerface between a channel layer of undoped GaN and a bather layer of AlGaN is canceled by piezoelectric polarization produced at the heterointerface between the barrier layer of AlGaN and a p-type GaN layer. This structure reduces the concentration of two-dimensional electron gas immediately under a gate region where the p-type GaN layer is formed, thus obtaining normally-off characteristics. The use of a pn junction having a larger built-in potential than that of a Schottky junction for gate advantageously reduces gate leakage current even with an application of a positive gate voltage.

SUMMARY OF THE INVENTION

The present inventors actually fabricated the conventional JFET described above to find the problem of occurrence of so-called current collapse. Specifically, when the gate is switched from OFF to ON immediately after an application of a high drain voltage, drain current decreases and the ON resistance increases, as compared to the case where lower drain voltage is applied. The increase in ON resistance due to the current collapse is a serious problem in power transistors to which high drain voltages are applied.

It is therefore an object of the present invention to suppress occurrence of current collapse to implement a normally-off nitride semiconductor device applicable to a power transistor.

To achieve the object, a nitride semiconductor device according to the present invention has a structure in which a nitride semiconductor layer having a gate recess is formed on a nitride semiconductor layer forming a heterojunction interface and a p-type semiconductor layer is formed in the gate recess.

Specifically, a nitride semiconductor device according to the present invention includes: a substrate; a first nitride semiconductor layer formed on the substrate; a second nitride semiconductor layer formed on the first nitride semiconductor layer and having a band gap energy larger than that of the first nitride semiconductor layer; a third nitride semiconductor layer formed on the second nitride semiconductor layer and having an opening; a p-type fourth nitride semiconductor layer filling the opening; and a gate electrode formed on the fourth nitride semiconductor layer.

In the inventive nitride semiconductor device, a channel layer formed between the first nitride semiconductor layer and the second semiconductor layer is kept away from the surface. Accordingly, unlike a conventional nitride semiconductor device, a noticeable advantage in which the influence of the surface state on the channel layer is reduced and occurrence of current collapse resulting from the surface state is suppressed is obtained. In addition, since the second and third nitride semiconductor layers are both made of nitride semiconductor, these layers are allowed to be continuously grown. Accordingly, no interface state is formed in the interface between the second nitride semiconductor layer and the third nitride semiconductor layer so that the influence of the interface between the second and third nitride semiconductor layers does not need to be taken into consideration. With this structure, occurrence of current collapse is more effectively suppressed. Moreover, since the gate electrode is formed on the p-type fourth nitride semiconductor layer, the concentration of two-dimensional electron gas immediately under the gate electrode is selectively lower than that in the other region. As a result, normally-off characteristics are obtained. It is also possible to increase the range of the threshold voltage, thus implementing a threshold voltage of about +1V.

A method for fabricating a nitride semiconductor device includes the steps of: (a) epitaxially growing a first nitride semiconductor layer, a second nitride semiconductor layer having a band gap energy larger than that of the first nitride semiconductor layer and a third nitride semiconductor layer in sequence over a substrate; (b) selectively removing the third nitride semiconductor layer to form an opening; (c) epitaxially growing a p-type fourth nitride semiconductor layer to fill the opening therewith; and (d) forming a gate electrode on the fourth nitride semiconductor layer.

The inventive method for fabricating a nitride semiconductor device includes the step of epitaxially growing first through third nitride semiconductor layers in sequence. Thus, no interface state is formed in the interface between the second nitride semiconductor layer and the third nitride semiconductor layer. In addition, channel formed between the first nitride semiconductor layer and the second nitride semiconductor layer is kept away from the surface. Accordingly, the influence of the surface state on the channel layer is reduced, thus much more effectively suppressing occurrence of current collapse resulting from the surface state, than in a conventional method. The inventive method also includes the step of epitaxially growing a p-type fourth nitride semiconductor layer so that an opening is filled therewith. Thus, a normally-off nitride semiconductor device is easily fabricated.

DETAILED DESCRIPTION OF THE INVENTION

Embodiment 1

Figure 1:
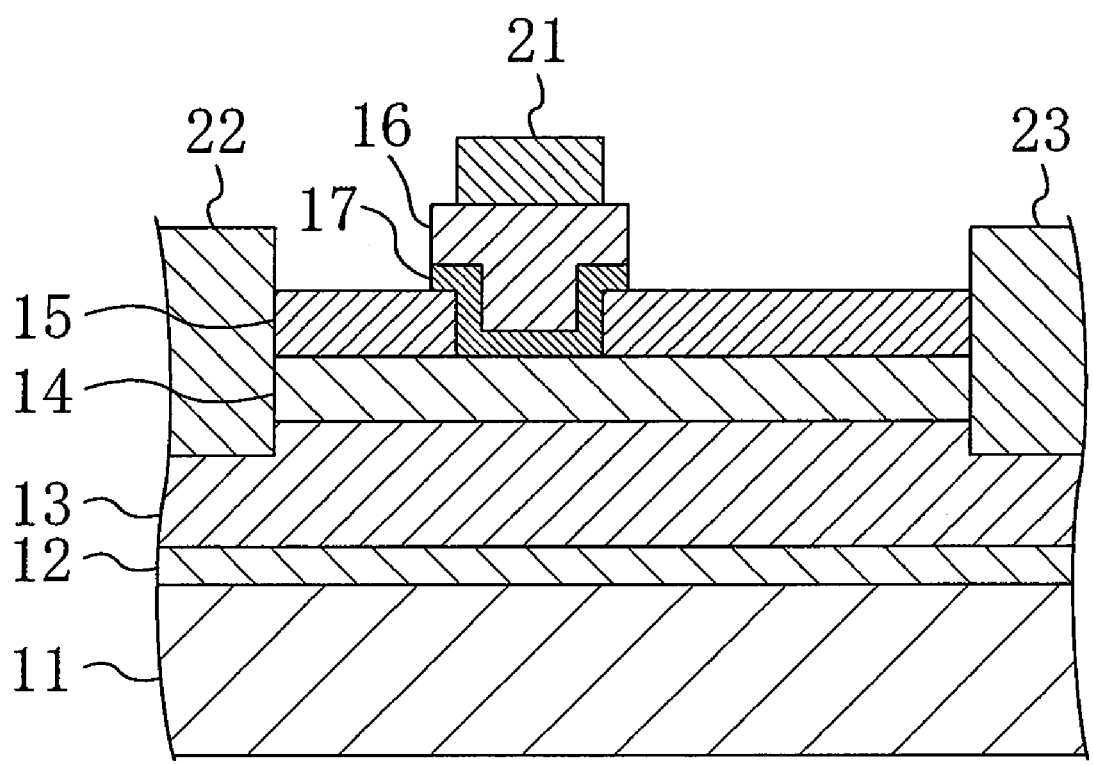
FIG. 1 is a cross-sectional view illustrating a nitride semiconductor device according to a first embodiment of the present invention.

A first embodiment of the present invention will be described with reference to the drawings. FIG. 1 is a cross-sectional view illustrating a nitride semiconductor device according to the first embodiment. A buffer layer 12 made of AlN and having a thickness of 100 nm, a first nitride semiconductor layer 13 made of undoped GaN and having a thickness of 2 μm, a second nitride semiconductor layer 14 made of undoped AlGaN and having a thickness of 15 nm, and a third nitride semiconductor layer 15 made of n-type AlGaN and having a thickness of 30 nm are formed on a c-plane sapphire substrate 11. The gate region of the third nitride semiconductor layer 15 has an opening in which the second nitride semiconductor layer 14 is exposed. A fourth nitride semiconductor layer 16 with a thickness of 100 nm is formed above the third nitride semiconductor layer 15 to fill the opening. A fifth nitride semiconductor layer 17 made of undoped AlGaN and having a thickness of 5 nm is formed between the fourth nitride semiconductor layer 16 and the second and third nitride semiconductor layers 14 and 15. The term "undoped" herein means that no impurities are intentionally introduced.

A gate electrode 21 of palladium (Pd) is formed on the fourth nitride semiconductor layer 16. The gate electrode 21 is in ohmic contact with the fourth nitride semiconductor layer 16. Source/drain electrodes 22 and 23 are respectively formed at both sides of the gate electrode 21. In this embodiment, the source/drain electrodes 22 and 23 are formed in recesses formed by removing the fourth nitride semiconductor layer 16, the fifth nitride semiconductor layer 17, and parts of the third, second and first nitride semiconductor layers 15, 14 and 13. In this manner, the source/drain electrodes 22 and 23 are in direct contact with two-dimensional electron gas produced near the heterojunction interface between the first nitride semiconductor layer 13 and the second nitride semiconductor layer 14, thereby reducing the contact resistance. The source/drain electrodes 22 and 23 are a stack of a titanium (Ti) layer and an aluminum (Al) layer. The source/drain electrodes 22 and 23 are not necessarily formed in recesses, and only need to be in ohmic contact with the two-dimensional electron gas serving as channel.

Most part of the fourth nitride semiconductor layer 16 is doped with approximately $1 \times 10^{19}$ cm$^{-3}$ of magnesium (Mg). Thus, the carrier concentration is approximately $1 \times 10^{18}$ cm$^{-3}$. However, a region immediately under the gate electrode to a depth of approximately 10 nm is doped with approximately $1 \times 10^{20}$ cm$^{-3}$ of Mg. The carrier concentration of the third nitride semiconductor layer 15 is approximately $1 \times 10^{18}$ cm$^{-3}$.

In the nitride semiconductor device of this embodiment, the two-dimensional electron gas concentration immediately under the gate electrode is lower than that in the other region so that normally-off operation is implemented. In addition, because of the presence of the third nitride semiconductor layer 15, channel is kept away from the surface of the semiconductor layers between the gate electrode 21 and the source electrode 22 and between the gate electrode 21 and the drain electrode 23. Accordingly, channel is not susceptible to the influence of the surface state occurring in the surface of the semiconductor layers. As a result, occurrence of current collapse is suppressed.

The current collapse is considered to be due to electrons trapped in the surface state. In the absence of the third nitride semiconductor layer 15, with application of a high drain bias of about several tens of voltages in the OFF state, the two-dimensional electron gas between the gate and the drain would be depleted by electrons trapped in the surface state of the second nitride semiconductor layer 14. Since the time necessary for electron emission from the surface state is longer than that for electron capture, a depletion layer is also formed between the gate and the drain immediately after the gate is turned ON state. Accordingly, it is considered that channel does not fully open so that the channel resistance increases.

On the other hand, in the nitride semiconductor device of this embodiment including the third nitride semiconductor layer 15, the distance between the channel and the surface state is large. Thus, even with an application of a high drain bias in the ON state, no depletion region is formed in the two-dimensional electron gas between the gate and the drain. Accordingly, the channel fully opens immediately after the gate is turned ON state, resulting in that the channel resistance does not increase.

To suppress occurrence of current collapse more effectively, the thickness of the third nitride semiconductor layer 15 is preferably 15 nm or more, and the carrier concentration of the third nitride semiconductor layer 15 is preferably $1 \times 10^{17}$ cm$^{-3}$ or more. The third nitride semiconductor layer is preferably of the n-type. In this case, the concentration of the two-dimensional electron gas is increased. In addition, the current collapse is more effectively suppressed. The third nitride semiconductor layer 15 may be undoped.

With such a structure, the two layers, i.e., the second nitride semiconductor layer 14 of undoped AlGaN and the third nitride semiconductor layer 15 of n-type AlGaN, are present above the channel, between the gate electrode 21 and the source electrode 22 or between the gate electrode 21 and the drain electrode 23. Accordingly, the capability of supplying electrons to the channel is enhanced so that the two-dimensional electron gas concentration in the channel is selectively increased, thus reducing the channel resistance. As a result, in the normally-off FET, it is possible to suppress occurrence of current collapse, while reducing the ON resistance.

In addition, since the second nitride semiconductor layer 14 and the third nitride semiconductor layer 15 are both nitride semiconductor, these layers are allowed to be continuously formed, thereby forming no surface state in the interface between these layers. Thus, electrons are trapped only in the surface state in the third nitride semiconductor layer 15, resulting in effectively suppressing occurrence of current collapse.

The fourth nitride semiconductor layer 16 forming the gate region is formed at a position closer to the source electrode 22. This is because the distance between the gate electrode 21 and the drain electrode 23 is increased to reduce an electric field occurring with an application of a high drain voltage so that the breakdown voltage of the transistor is increased.

The nitride semiconductor device of this embodiment includes the fifth nitride semiconductor layer 17. If the fourth nitride semiconductor layer 16 was re-grown directly on the second nitride semiconductor layer 14, the difference in lattice constant between AlGaN and GaN might cause a lattice mismatch. Accordingly, gate leakage current would increase with deterioration of crystallinity of the fourth nitride semiconductor layer 16. On the other hand, in this embodiment, the fifth nitride semiconductor layer 17 made of AlGaN, which is also used for the second nitride semiconductor layer 14, is re-grown so that a lattice mismatch in the re-growth interface is reduced. Accordingly, the fourth nitride semiconductor layer 16 of GaN is formed successively after the formation of the fifth nitride semiconductor layer 17 so that a lattice mismatch occurring at the re-growth is reduced, thus forming the fourth nitride semiconductor layer 16 with excellent crystallinity. The fifth nitride semiconductor layer 17 is preferably a layer having a composition which is not likely to cause a lattice mismatch with the second nitride semiconductor layer 14. Specifically, the fifth nitride semiconductor layer 17 is preferably made of a material having a lattice constant difference between the fifth nitride semiconductor layer 17 and the second nitride semiconductor layer 14 smaller than that between the fourth nitride semiconductor layer 16 and the second nitride semiconductor layer 14. The fifth nitride semiconductor layer 17 is not necessarily undoped and may be of the p-type.

Figure 2A:
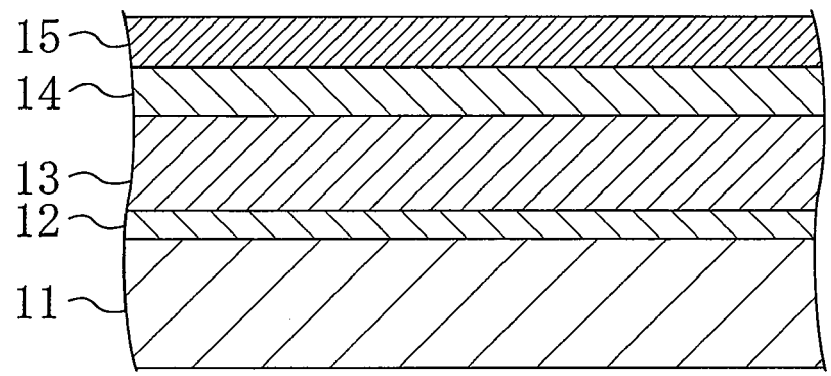
FIGS. 2A through 2C are cross-sectional views showing respective process steps of a method for fabricating a nitride semiconductor device according to the first embodiment in the order of fabrication.

Hereinafter, a method for fabricating a nitride semiconductor device according to the first embodiment will be described. First, as shown in FIG. 2A, a buffer layer 12 made of AlN and having a thickness of 100 nm, a first nitride semiconductor layer 13 made of undoped GaN and having a thickness of 2 μm, a second nitride semiconductor layer 14 made of undoped AlGaN and having a thickness of 15 nm, and a third nitride semiconductor layer 15 made of n-type AlGaN and having a thickness of 30 nm are epitaxially grown in sequence on a c-plane sapphire substrate 11 by metal organic chemical vapor deposition (MOCVD).

Figure 2B:
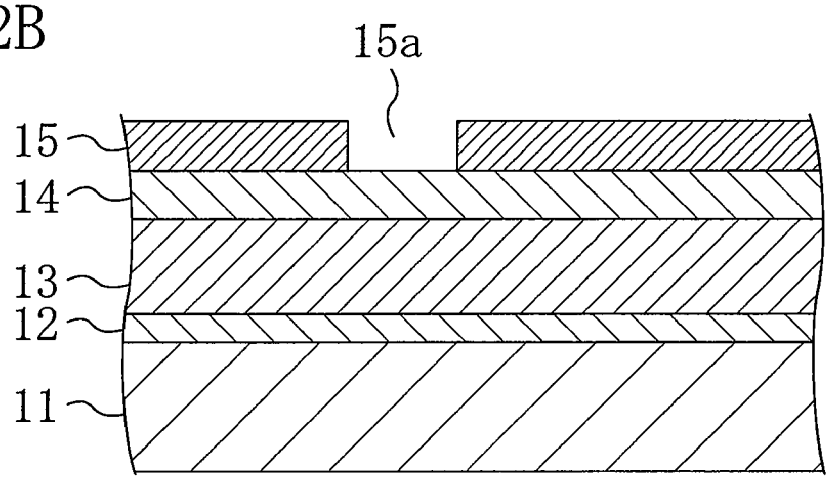

Then, as shown in FIG. 2B, part of the third nitride semiconductor layer 15 in a gate region is selectively removed, thereby forming an opening 15a which is to serve as a gate recess. The third nitride semiconductor layer 15 is preferably etched by wet etching with ultraviolet radiation using approximately 10 mol/l of a potassium hydroxide solution as an etchant. In this etching, the second nitride semiconductor layer 14 made of undoped AlGaN functions as an etching stopper so that the opening 15a is formed with high reproducibility. In addition, the second nitride semiconductor layer 14 does not suffer from any etching damage. The opening 15a may be formed by dry etching using a gas such as a chlorine gas.

Figure 2C:
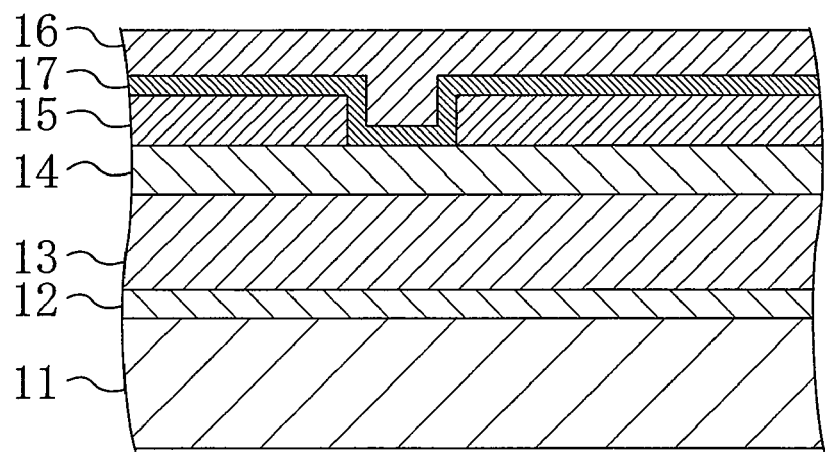

Subsequently, as shown in FIG. 2C, a fifth nitride semiconductor layer 17 made of undoped AlGaN and having a thickness of 5 nm and a fourth nitride semiconductor layer 16 made of p-type GaN and having a thickness of 100 nm are epitaxially grown in sequence by MOCVD. In this process, the fifth nitride semiconductor layer 17 and the fourth nitride semiconductor layer 16 may be formed only in the gate region using a mask of an insulating film such as a silicon oxide film. In this case, a subsequent process of etching the fifth nitride semiconductor layer 17 and the fourth nitride semiconductor layer 16 may be omitted.

Figure 3A:
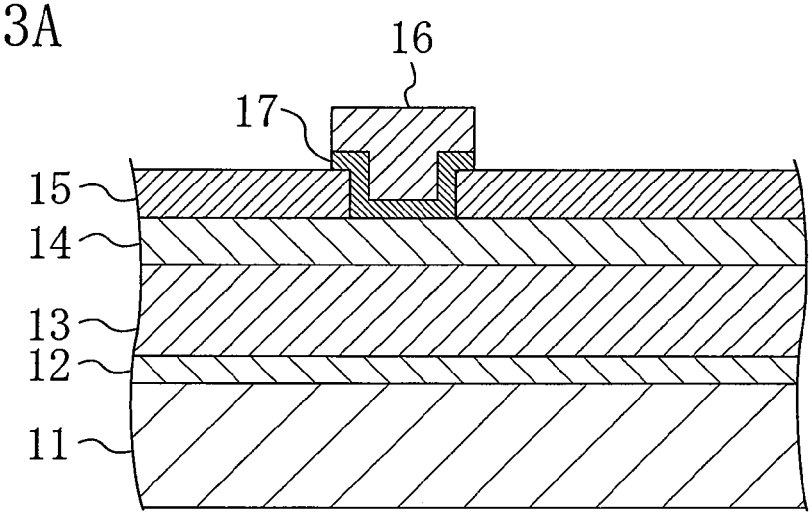
FIGS. 3A through 3C are cross-sectional views showing respective process steps of the method for fabricating a nitride semiconductor device of the first embodiment in the order of fabrication.

Thereafter, as shown in FIG. 3A, parts of the fourth nitride semiconductor layer 16 and the fifth nitride semiconductor layer 17 formed in a region except for the gate region are selectively removed by, for example, dry etching with an inductive-coupled plasma (ICP) using a gas such as a chlorine gas.

Figure 3B:
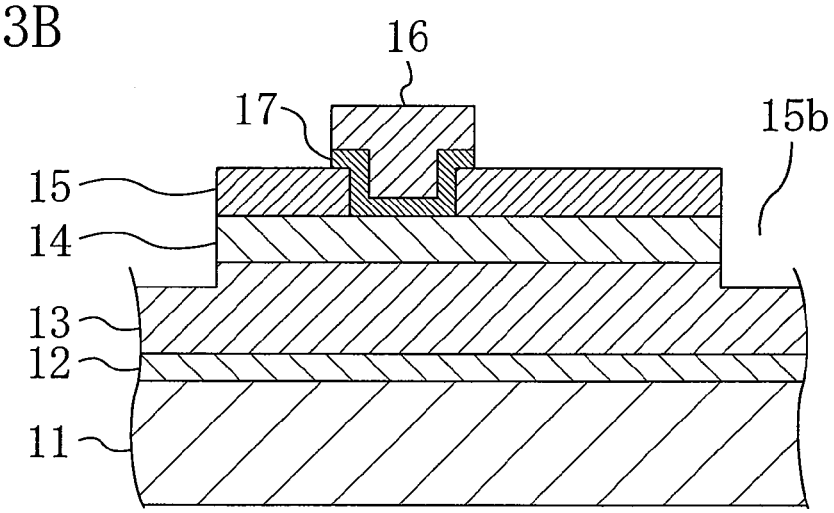

Then, as shown in FIG. 3B, the third nitride semiconductor layer 15 and parts of the second nitride semiconductor layer 14 and the first nitride semiconductor layer 13 in a region where source/drain electrodes are to be formed are selectively removed by, for example, ICP etching using a gas such as a chlorine gas, thereby forming recesses 15b.

Figure 3C:
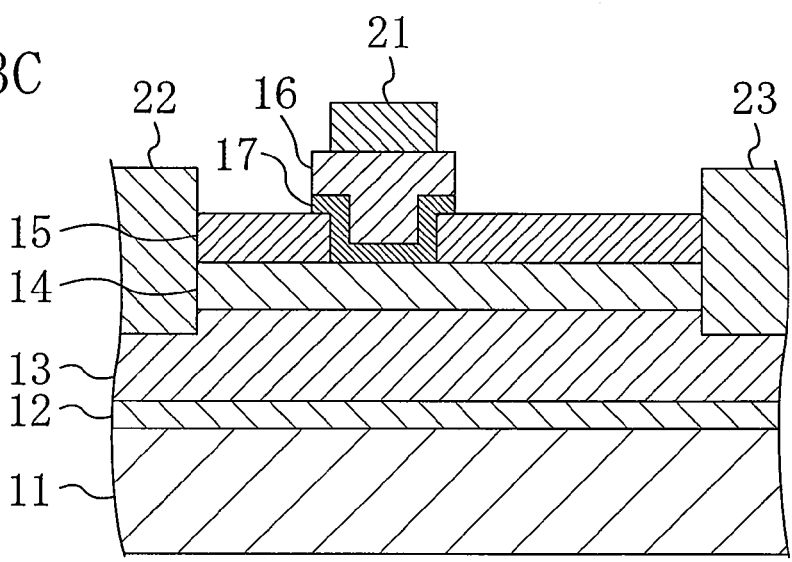

Subsequently, as shown in FIG. 3C, a Ti layer and an Al layer are formed in the recesses 15b, and then a heat process is performed at 650° C. in a nitrogen atmosphere, thereby forming a source electrode 22 and a drain electrode 23. At last, a gate electrode 21 made of Pd is formed on the fourth nitride semiconductor layer 16.

Embodiment 2

Figure 4:
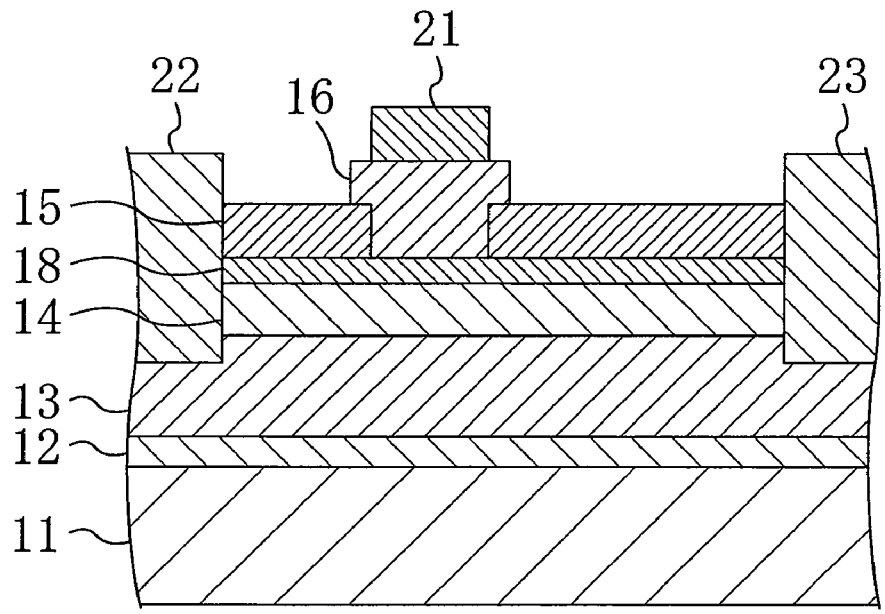
FIG. 4 is a cross-sectional view illustrating a nitride semiconductor device according to a second embodiment of the present invention.

Now, a second embodiment of the present invention will be described with reference to the drawing. FIG. 4 is a cross-sectional view showing a structure of a nitride semiconductor device according to the second embodiment. In FIG. 4, components also shown in FIG. 1 are denoted by the same reference numerals, and thus description thereof will be omitted.

The nitride semiconductor device of the second embodiment includes a sixth nitride semiconductor layer 18 formed between a second nitride semiconductor layer 14 and a third nitride semiconductor layer 15. The sixth nitride semiconductor layer 18 is made of p-type GaN and has a thickness of 5 nm. The sixth nitride semiconductor layer 18 is doped with approximately $1 \times 10^{19}$ cm$^{-3}$ of Mg and has a carrier concentration of approximately $1 \times 10^{18}$ cm$^{-3}$.

The sixth nitride semiconductor layer 18 functions as an etching stopper during wet etching for forming an opening in the third nitride semiconductor layer 15. In the first embodiment, the undoped second nitride semiconductor layer 14 functions as an etching stopper during the wet etching. In this embodiment, the p-type sixth nitride semiconductor layer 18 stops wet etching without fail.

In addition, in this embodiment, the sixth nitride semiconductor layer 18 and a fourth nitride semiconductor layer 16 are both made of GaN. This eliminates a lattice mismatch occurring when the fourth nitride semiconductor layer 16 is re-grown on the sixth nitride semiconductor layer 18. Accordingly, the crystallinity of the fourth nitride semiconductor layer 16 is enhanced. The sixth nitride semiconductor layer 18 and the fourth nitride semiconductor layer 16 preferably have the same composition as in this embodiment. In this case, the crystallinity of the fourth nitride semiconductor layer 16 is more effectively enhanced. However, these layers may have other compositions as long as a lattice mismatch at the growth interface is reduced. Specifically, the difference in lattice constant between the sixth nitride semiconductor layer 18 and the fourth nitride semiconductor layer 16 is preferably smaller than that between the second nitride semiconductor layer 14 and the fourth nitride semiconductor layer 16.

Modified Example 1 of Embodiment 2

Figure 5:
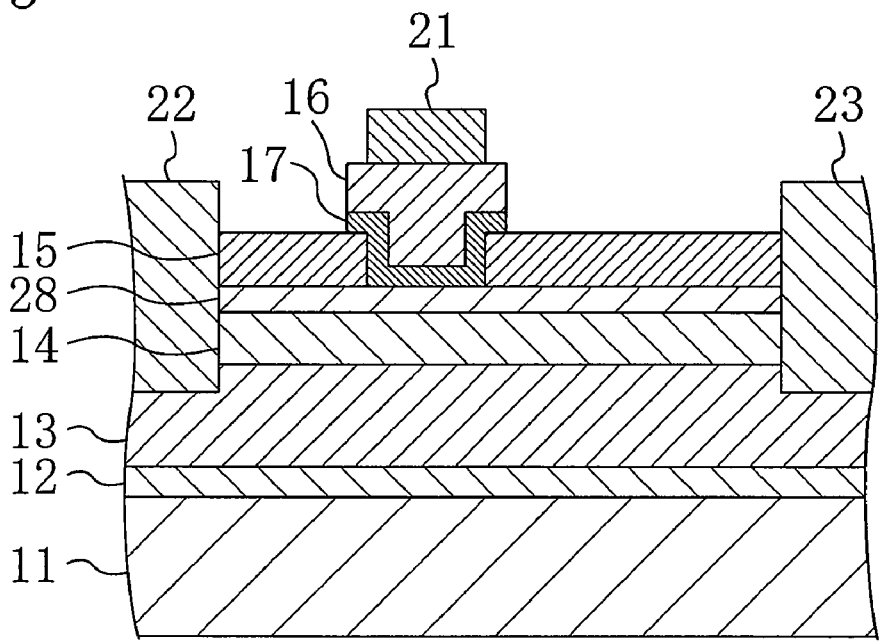
FIG. 5 is a cross-sectional view illustrating a nitride semiconductor device according to a first modified example of the second embodiment.

Now, a first modified example of the second embodiment will be described with reference to the drawing. FIG. 5 is a cross-sectional view showing a structure of a nitride semiconductor device according to the first modified example of the second embodiment. In FIG. 5, components also shown in FIG. 1 are denoted by the same reference numerals, and thus description thereof will be omitted.

The nitride semiconductor device of this modified example includes a sixth nitride semiconductor layer 28 formed between the second nitride semiconductor layer 14 and the third nitride semiconductor layer 15 and made of p-type AlGaN. In this structure, the AlGaN layer having a large band gap forms a pn junction interface. Accordingly, gate leakage current is reduced.

In this modified example, the fifth nitride semiconductor layer 17 made of p-type AlGaN is formed in order to enhance the crystallinity of the fourth nitride semiconductor layer 16. However, the fifth nitride semiconductor layer 17 may be omitted. The lattice mismatch between the fifth nitride semiconductor layer 17 and the sixth nitride semiconductor layer 28 is preferably small. Specifically, the difference in lattice constant between the sixth nitride semiconductor layer 28 and the fifth nitride semiconductor layer 17 is preferably smaller than that between the sixth nitride semiconductor layer 28 and the fourth nitride semiconductor layer 16.

To reduce gate leakage current, the sixth nitride semiconductor layer 28 preferably has a band gap larger than that of the fourth nitride semiconductor layer 16. The sixth nitride semiconductor layer 28 preferably has the same Al content as the second nitride semiconductor layer 14. In this case, the sixth nitride semiconductor layer 28 is easily formed. However, the sixth nitride semiconductor layer 28 and the second nitride semiconductor layer 14 may have different Al contents. For example, the composition of the second nitride semiconductor layer 14 may be $Al_{0.15}Ga_{0.85}N$ and the composition of the sixth nitride semiconductor layer 28 may be $Al_{0.10}Ga_{0.90}N$.

Modified Example 2 of Embodiment 2

Figure 6:
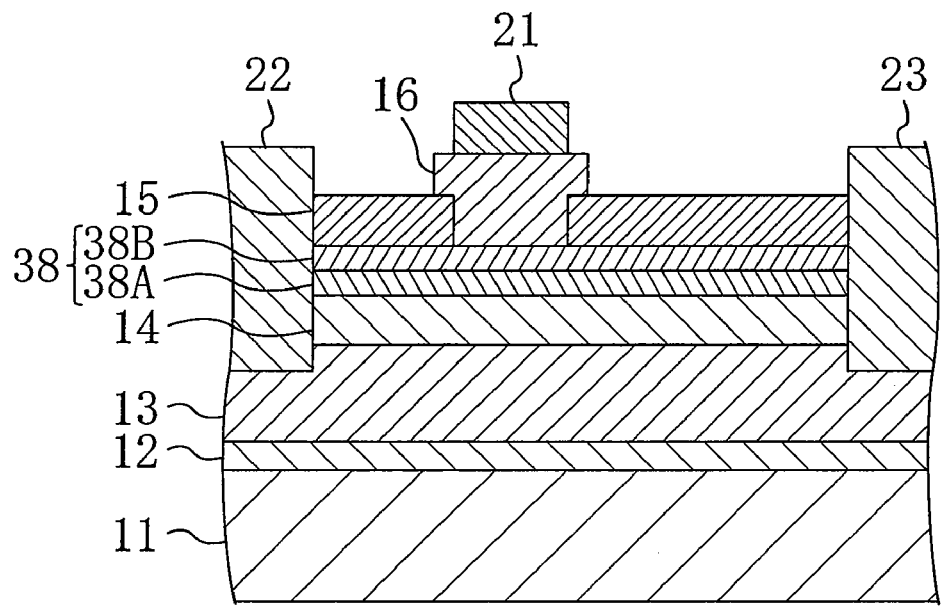
FIG. 6 is a cross-sectional view illustrating a nitride semiconductor device according to a second modified example of the second embodiment.

Now, a second modified example of the second embodiment will be described with reference to the drawing. FIG. 6 is a cross-sectional view showing a structure of a nitride semiconductor device according to the second modified example of the second embodiment. In FIG. 6, components also shown in FIG. 1 are denoted by the same reference numerals, and thus description thereof will be omitted.

The nitride semiconductor device of this modified example includes a sixth nitride semiconductor layer 38 formed between the second nitride semiconductor layer 14 and the third nitride semiconductor layer 15. The sixth nitride semiconductor layer 38 includes a first p-type layer 38A made of p-type AlGaN and having a thickness of 5 nm and a second p-type layer 38B made of GaN and having a thickness of 5 nm.

In the nitride semiconductor device of this modified example, the pn junction interface is made of the AlGaN layer having a large band gap so that gate leakage current is reduced. In addition, the fourth nitride semiconductor layer 16 and the second p-type layer 38B have the same composition so that no lattice mismatch occurs at the growth interface during the epitaxial growth of the fourth nitride semiconductor layer 16. Accordingly, the crystallinity of the fourth nitride semiconductor layer 16 is enhanced.

To reduce gate leakage current, the first p-type layer 38A preferably has a band gap larger than that of the second p-type layer 38B. The first p-type layer 38A preferably has the same Al content as the second nitride semiconductor layer 14. In this case, the first p-type layer 38A is easily formed. However, the first p-type layer 38A and the second nitride semiconductor layer 14 may have different Al contents. For example, the composition of the second nitride semiconductor layer 14 may be $Al_{0.15}Ga_{0.85}N$ and the composition of the second p-type layer 38B may be $Al_{0.10}Ga_{0.90}N$.

The second p-type layer 38B and the fourth nitride semiconductor layer 16 preferably have the same composition. In this case, the crystallinity of the fourth nitride semiconductor layer 16 is more effectively enhanced. However, these layers may have different compositions as long as a lattice mismatch at the growth interface is reduced. Specifically, the difference in lattice constant between the second p-type layer 38B and the fourth nitride semiconductor layer 16 is preferably smaller than that between the first p-type layer 38A and the fourth nitride semiconductor layer 16.

Embodiment 3

Figure 7:
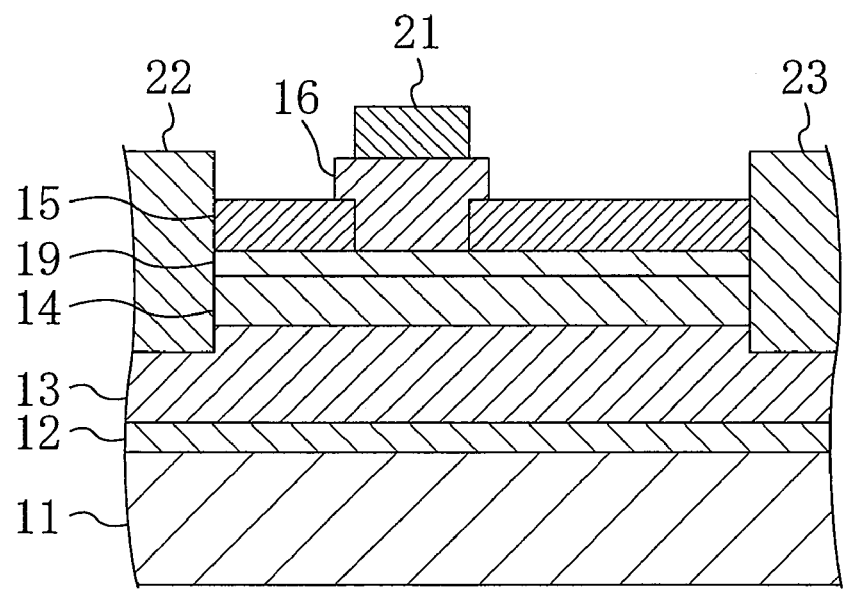
FIG. 7 is a cross-sectional view illustrating a nitride semiconductor device according to a third embodiment of the present invention.

Now, a third embodiment of the present invention will be described with reference to the drawing. FIG. 7 is a cross-sectional view showing a structure of a nitride semiconductor device according to the third embodiment. In FIG. 7, components also shown in FIG. 1 are denoted by the same reference numerals, and thus description thereof will be omitted.

The nitride semiconductor device of the third embodiment includes a sixth nitride semiconductor layer 19 between a second nitride semiconductor layer 14 and a third nitride semiconductor layer 15. The sixth nitride semiconductor layer 19 is made of n-type GaN and has a thickness of 5 nm.

The sixth nitride semiconductor layer 19 functions as an etching stopper during wet etching for forming an opening in the third nitride semiconductor layer 15. In the second embodiment, the p-type sixth nitride semiconductor layer 18 functions as an etching stopper during the wet etching. On the other hand, in the third embodiment, though the sixth nitride semiconductor layer 19 is of the n-type, which is the same conductivity as the third nitride semiconductor layer 15 to be etched, the sixth nitride semiconductor layer 19 has a band gap smaller than that of the third nitride semiconductor layer 15, thus enabling stopping of the wet etching.

In the foregoing embodiments and modified examples, the substrate 11 is a sapphire (0001) substrate. However, the substrate 11 may be made of any material such as SiC, GaN, or Si. The substrate 11 may have any orientation as long as excellent crystallinity is obtained.

In the case where the first nitride semiconductor layer 13 is made of GaN, the composition of the second nitride semiconductor layer 14 is $Al_{0.15}Ga_{0.85}N$ in order to form excellent channel. The An content thereof may be appropriately changed.

The third nitride semiconductor layer 15 and the second nitride semiconductor layer 14 may have the same composition or may have different compositions. Instead of AlGaN, either AlN including no Ga or GaN including no Al may be used. In the case of AlN, the layers are preferably epitaxially grown in an amorphous state at a low temperature of approximately 500° C. In general, if an AlN layer is formed on a thick GaN layer having a thickness of several micrometers, a lattice mismatch is large so that cracks easily occur. However, if the AlN layer is grown at a low temperature, no cracks occur to a thickness of about 30 nm. In addition, since the AlN layer which has grown at a low temperature is easily wet etched with an alkaline solution such as a developer, the advantage of easy formation of an opening is obtained.

The fourth nitride semiconductor layer 16 is preferably made of GaN. In this case, Mg is easily activated. However, the fourth nitride semiconductor layer 16 may have another composition.

The thickness of the sixth nitride semiconductor layer may be appropriately changed. However, in the case where the sixth nitride semiconductor layer is of the p-type, an excessive thickness of the sixth nitride semiconductor layer would cause leakage current to flow through the sixth nitride semiconductor layer. Thus, the thickness of the sixth nitride semiconductor layer may be in the range where holes are depleted in the region between the gate electrode and the drain electrode and between the gate electrode and the source electrode.

The gate electrode may be made of other metals such as Ni as long as an excellent ohmic contact is obtained.

In the foregoing embodiments, GaN and AlGaN are used as nitride semiconductor materials. However, the present invention is not limited to these materials. For example, InGaN and AlInGaN may be used. The thicknesses of the layers may be appropriately changed.

As described above, a nitride semiconductor device and a method for fabricating the nitride semiconductor device according to the present invention allow a normally-off nitride semiconductor device in which the ON resistance is low and occurrence of current collapse is suppressed to be implemented and, thus, are useful especially as a power transistor for use in a power supply circuit in consumer equipment such as a television set and a method for fabricating the power transistor, for example.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A nitride semiconductor device, comprising:
   a substrate;
   a nitride semiconductor layer made of GaN and formed on the substrate;
   a nitride semiconductor layer made of AlGaN and formed on the nitride semiconductor layer made of GaN;
   a p-type nitride semiconductor layer filling an opening formed on the nitride semiconductor layer made of AlGaN;
   a gate electrode formed on the p-type nitride semiconductor layer; and source/drain electrodes respectively formed at sides of the gate electrode, wherein
   a distance between the opening and the source electrode differs from a distance between the gate electrode and the drain electrode.

2. The nitride semiconductor device of claim 1, wherein the nitride semiconductor layer made of AlGaN is of an n-type.

3. The nitride semiconductor device of claim 1, wherein the distance between the opening and the source electrode is smaller than the distance between the gate electrode and the drain electrode.

4. A nitride semiconductor device, comprising:
   a substrate;
   a first nitride semiconductor layer formed on the substrate;
   a second nitride semiconductor layer formed on the first nitride semiconductor layer and having a band gap energy larger than that of the first nitride semiconductor layer;
   a third nitride semiconductor layer formed on the second nitride semiconductor layer and having an opening;
   a p-type fourth nitride semiconductor layer filling the opening; and
   a gate electrode formed on the fourth nitride semiconductor layer, wherein
   a distance between the opening and the source electrode differs from a distance between the opening and the drain electrode.

5. The nitride semiconductor device of claim 4, wherein the distance between the opening and the source electrode is smaller than the distance between the opening and the drain electrode.

6. The nitride semiconductor device of claim 4, wherein the gate electrode has a width smaller than that of the fourth nitride semiconductor layer.

7. The nitride semiconductor device of claim 4, wherein the third nitride semiconductor layer is of an n-type.

8. The nitride semiconductor device of claim 4, further including a fifth nitride semiconductor layer formed between the second nitride semiconductor layer and the fourth nitride semiconductor layer.

9. The nitride semiconductor device of claim 8, wherein a difference in lattice constant between the second nitride semiconductor layer and the fifth nitride semiconductor layer is smaller than that between the second nitride semiconductor layer and the fourth nitride semiconductor layer.

10. The nitride semiconductor device of claim 4, further including a sixth nitride semiconductor layer formed between the second nitride semiconductor layer and the third nitride semiconductor layer.

11. The nitride semiconductor device of claim 10, wherein the sixth nitride semiconductor layer is of a p-type.

12. The nitride semiconductor device of claim 11, wherein a difference in lattice constant between the sixth nitride semiconductor layer and the fourth nitride semiconductor layer is smaller than that between the second nitride semiconductor layer and the fourth nitride semiconductor layer.

13. The nitride semiconductor device of claim 11, wherein the sixth nitride semiconductor layer has a band gap energy larger than that of the fourth nitride semiconductor layer.

14. The nitride semiconductor device of claim 13, further including a fifth nitride semiconductor layer formed between the sixth nitride semiconductor layer and the fourth nitride semiconductor layer.

15. The nitride semiconductor device of claim 14, wherein a difference in lattice constant between the sixth nitride semiconductor layer and the fifth nitride semiconductor layer is smaller than that between the sixth nitride semiconductor layer and the fourth nitride semiconductor layer.

16. The nitride semiconductor device of claim 10, wherein the sixth nitride semiconductor layer includes a first p-type layer and a second p-type layer formed on the first p-type layer.

17. The nitride semiconductor device of claim 16, wherein the first p-type layer has a band gap energy larger than that of the second p-type layer, and a difference in lattice constant between the second p-type layer and the fourth nitride semiconductor layer is smaller than that between the first p-type layer and the fourth nitride semiconductor layer.

18. The nitride semiconductor device of claim 10, wherein the sixth nitride semiconductor layer is of an n-type.

19. The nitride semiconductor device of claim 18, wherein the sixth nitride semiconductor layer has a band gap energy smaller than that of the third nitride semiconductor layer.

20. The nitride semiconductor device of claim 4, wherein the nitride semiconductor device is of a normally-off type.

* * * * *